United States Patent
Liu et al.

(10) Patent No.: US 12,050,101 B2
(45) Date of Patent: Jul. 30, 2024

(54) SENSING CIRCUIT, LOGIC CIRCUIT BOARD, JOINT CONTROL BOARD, MAIN CONTROLLER BOARD, AND ROBOT

(71) Applicant: SHENZHEN YUEJIANG TECHNOLOGY CO., LTD., Shenzhen (CN)

(72) Inventors: Peichao Liu, Shenzhen (CN); Zheng Ju, Shenzhen (CN); Rui Huang, Shenzhen (CN); Junpeng Zhang, Shenzhen (CN); Langxian Yao, Shenzhen (CN); Xulin Lang, Shenzhen (CN)

(73) Assignee: SHENZHEN YUEJIANG TECHNOLOGY CO., LTD., Guangdong (CN)

( * ) Notice: Subject to any disclaimer, the term of this patent is extended or adjusted under 35 U.S.C. 154(b) by 608 days.

(21) Appl. No.: 17/214,718

(22) Filed: Mar. 26, 2021

(65) Prior Publication Data

US 2021/0237286 A1 Aug. 5, 2021

Related U.S. Application Data

(63) Continuation-in-part of application No. PCT/CN2019/106040, filed on Sep. 17, 2019.

(30) Foreign Application Priority Data

Aug. 2, 2019 (CN) .......................... 201921252998.9
Aug. 2, 2019 (CN) .......................... 201921258844.0
Aug. 2, 2019 (CN) .......................... 201921265549.8

(51) Int. Cl.
*G01B 7/02* (2006.01)
*B25J 9/16* (2006.01)
(Continued)

(52) U.S. Cl.
CPC .............. *G01B 7/023* (2013.01); *B25J 9/161* (2013.01); *B25J 9/1651* (2013.01); *B25J 9/1666* (2013.01);
(Continued)

(58) Field of Classification Search
CPC .. G01B 7/023; G01B 7/14; B25J 9/161; B25J 9/1651; B25J 9/1666; B25J 9/1694;
(Continued)

(56) References Cited

U.S. PATENT DOCUMENTS 4,661,797 A   4/1987 Schmall
5,988,971 A   11/1999 Fossey et al.
(Continued)

FOREIGN PATENT DOCUMENTS

CA   2827699 A1   3/2014
CN   1220931 A    6/1999
(Continued)

OTHER PUBLICATIONS

Dean-Leon, Emmanuel et al. "Robotic Technologies for Fast Deployment of Industrial Robot Systems", IEEE, (2016), p. 6900-6907.
(Continued)

*Primary Examiner* — Raul J Rios Russo
(74) *Attorney, Agent, or Firm* — LOZA & LOZA LLP; Michael Fedrick

(57) ABSTRACT

A sensing circuit (51) including a connection terminal (514) configured to couple with an electrode (32) located on a housing of a mechanical device; and a detection circuit (513) configured to couple with the connection terminal (514) to detect a distance between the electrode (32) and an external conductor or a change of the distance between the electrode and an external conductor by utilizing a capacitance between the electrode (32) and the external conductor or a change of the capacitance between the electrode (32) and the external
(Continued)

conductor, thus obtaining an electrical signal representing the distance between the electrode (32) and the external conductor or a change of the distance between the electrode (32) and the external conductor. The sensing circuit can perform non-contact distance detection on a grounded object.

21 Claims, 8 Drawing Sheets

(51) Int. Cl.
    *B25J 13/08*     (2006.01)
    *B25J 19/02*     (2006.01)
    *G01B 7/14*     (2006.01)
    *G01D 5/24*     (2006.01)
    *G01D 5/241*     (2006.01)
    *G01R 21/00*     (2006.01)
    *G01R 22/02*     (2006.01)
    *G01V 3/08*     (2006.01)
    *H03J 1/00*     (2006.01)

(52) U.S. Cl.
    CPC ........... *B25J 9/1694* (2013.01); *B25J 13/086* (2013.01); *B25J 13/089* (2013.01); *B25J 19/02* (2013.01); *G01B 7/14* (2013.01); *G01D 5/24* (2013.01); *G01D 5/241* (2013.01); *G01R 21/00* (2013.01); *G01R 22/02* (2013.01); *G01V 3/088* (2013.01); *H03J 1/005* (2013.01); *H03J 2200/10* (2013.01); *H03J 2200/29* (2013.01)

(58) Field of Classification Search
    CPC ........ B25J 13/086; B25J 13/089; B25J 19/02; B25J 9/1676; B25J 19/027; G01D 5/24; G01D 5/241; G01D 5/243; G01D 5/2417; G01V 3/088; G05B 2219/37284; G05B 19/0423; G05B 2219/25257; H03K 17/955; G01R 11/46; G01R 21/00; G01R 22/02; H03J 1/005; H03J 2200/10; H03J 2200/29
    USPC ........................................................ 324/135
See application file for complete search history.

(56) References Cited

U.S. PATENT DOCUMENTS

| 2004/0187593 A1 | 9/2004 | Okada |
| 2008/0125893 A1 | 5/2008 | Tilove et al. |
| 2008/0306628 A1 | 12/2008 | Ng-Thow-Hing et al. |
| 2017/0066130 A1 | 3/2017 | Corkum et al. |
| 2017/0257094 A1 | 9/2017 | Schupp et al. |
| 2018/0236667 A1 | 8/2018 | Gombert et al. |
| 2019/0145798 A1 | 5/2019 | Kamiya et al. |
| 2021/0237271 A1* | 8/2021 | Liu .................. G01D 5/241 |
| 2021/0255350 A1* | 8/2021 | Liu .................. B25J 9/1694 |
| 2022/0170974 A1* | 6/2022 | Dai .................. B25J 13/086 |

FOREIGN PATENT DOCUMENTS

| CN | 1788859 A | 6/2006 |
| CN | 102015223 A | 4/2011 |
| CN | 201903787 U | 7/2011 |
| CN | 103299776 A | 9/2013 |
| CN | 104765363 A | 7/2015 |
| CN | 105225985 A | 1/2016 |
| CN | 205996974 U | 3/2017 |
| CN | 106695889 A | 5/2017 |
| CN | 106716838 A | 5/2017 |
| CN | 106926239 A | 7/2017 |
| CN | 206296915 U | 7/2017 |
| CN | 107000214 A | 8/2017 |
| CN | 206499476 U | 9/2017 |
| CN | 107229277 A | 10/2017 |
| CN | 107436159 A | 12/2017 |
| CN | 206818356 U | 12/2017 |
| CN | 206946502 U | 1/2018 |
| CN | 108241373 A | 7/2018 |
| CN | 108602187 A | 9/2018 |
| CN | 108637460 A | 10/2018 |
| CN | 109382823 A | 2/2019 |
| CN | 109397272 A | 3/2019 |
| CN | 109544872 A | 3/2019 |
| CN | 109708785 A | 5/2019 |
| CN | 109716652 A | 5/2019 |
| CN | 109773764 A | 5/2019 |
| CN | 109773832 A | 5/2019 |
| CN | 110315556 A | 10/2019 |
| CN | 112605998 A | 4/2021 |
| DE | 10061351 A1 | 6/2002 |
| DE | 102010047198 A1 | 4/2012 |
| EP | 0158593 A1 | 10/1985 |
| EP | 3246137 A1 | 11/2017 |
| EP | 3258602 A1 | 12/2017 |
| JP | H07241790 A | 9/1995 |
| JP | 2010010116 A | 1/2010 |
| WO | 2017191573 A1 | 11/2017 |
| WO | 2019030042 A1 | 2/2019 |

OTHER PUBLICATIONS

Yu, Yibo, "Resonance-Based Capacitive Sensing Using LDC2114", Application Report, SNOA970, Dec. 2017, 8 pgs.

* cited by examiner

SENSING CIRCUIT, LOGIC CIRCUIT BOARD, JOINT CONTROL BOARD, MAIN CONTROLLER BOARD, AND ROBOT

CROSS-REFERENCE TO RELATED APPLICATION

The present disclosure is a continuation-in-part of PCT Patent Application No. PCT/CN2019/106040, with an international filing date of Sep. 17, 2019, which claims priority to Chinese Patent Application Nos. 201921258844.0, 201921252998.9, and 201921265549.8, filed with the China National Intellectual Property Administration on Aug. 2, 2019, and entitled "robot electronic skin and robot," "non-contact electronic skin sensing circuit and device," and "communication layout structure of electronic skin system," respectively. The disclosures of the foregoing patent applications are incorporated herein by reference in their entirety.

TECHNICAL FIELD

The present disclosure relates to the technical field of electronic skin sensing, and in particular to an electronic skin sensing circuit for a mechanical device, a logic circuit board, a joint control board, a robot main controller board, a robot control system and a robot.

BACKGROUND

The main methods for the mechanical device to detect an approaching object are currently through the physical contact between the housing and the object. Taking the contact-type resistive housing as an example, the resistive housing depends on the deformation of the housing caused by the contact between the approaching object and the robot. The existing sensors perform the corresponding distance detection by detecting the direct contact signal, which may easily cause the mechanical device and the object to contact with each other and then cause the damage to the object.

SUMMARY

The present disclosure provides an electronic skin sensing circuit for a mechanical device, a logic circuit board, a joint control board, a robot main controller board, a robot control system, and a robot, so as to solve the technical problem that the mechanical device cannot achieve the non-contact distance detection to the grounded object.

In order to solve the above technical problem, a technical solution adopted in the present disclosure is to provide an electronic skin sensing circuit for a mechanical device. The sensing circuit comprises a connection terminal configured to couple with an electrode located on a housing of a mechanical device; a detection circuit configured to couple with the connection terminal to detect a distance between the electrode and an external conductor or a change of the distance between the electrode and an external conductor by utilizing a capacitance between the electrode and the external conductor or a change of the capacitance, thus obtaining an electrical signal representing the distance between the electrode and the external conductor or a change of the distance between the electrode and the external conductor.

In order to solve the above technical problem, another technical solution adopted in the present disclosure is to provide a logic circuit board. The logic circuit board comprises a microprocessor, a first communication terminal, and a second communication terminal; wherein the microprocessor is coupled with the first communication terminal and the second communication terminal, respectively, the first communication terminal is configured to couple with the above-mentioned sensing circuit, and the second communication terminal is configured to be connected with the robot control board.

In order to solve the above technical problem, another technical solution adopted in the present disclosure is to provide a joint control board. The joint control board comprises a microprocessor, a motor drive circuit, a first communication terminal, and a second communication terminal; wherein the microprocessor is coupled with the motor drive circuit, the first communication terminal, and the second communication terminal, respectively, the first communication terminal is configured to couple with the above-mentioned logic circuit board, the second communication terminal is configured to be connected with a robot main control board, and the motor drive circuit is configured to drive a robot to move.

In order to solve the above technical problem, another technical solution adopted in the present disclosure is to provide a robot main controller board. The robot main controller board comprises a microprocessor, a first communication terminal, and a second communication terminal; wherein the microprocessor is coupled with the first communication terminal and the second communication terminal, respectively, the first communication terminal is configured to couple with the above-mentioned logic circuit board or the above-mentioned joint control board, the second communication terminal is configured to be connected with the robot main control board; the microprocessor is configured to process the electrical signal from the sensing circuit to obtain an electrical signal representing the distance between the external conductor and the electrode or a change of the distance between the external conductor and the electrode.

In order to solve the above technical problem, another technical solution adopted in the present disclosure is to provide a robot control system. The robot control system comprises the above-mentioned sensing circuit, the above-mentioned logic circuit board, the above-mentioned joint control board, and the above-mentioned robot main controller board.

In order to solve the above technical problem, another technical solution adopted in the present disclosure is to provide a robot. The robot comprises the above-mentioned robot control system.

The beneficial effect of the present invention is that different from the prior art, the electronic skin sensing circuit for the mechanical device disclosed in the present disclosure has a detection circuit which is coupled with an electrode located on an electronic skin through the connection terminal. When an approaching conductor approaches an electrode, the electrode and the approaching conductor may constitute a capacitance. When a relative positional relationship between the approaching conductor and the electrode changes, a capacitance value of the capacitance will also change. A distance between the electrode and the conductor or a change of the distance between the electrode and the conductor may be further obtained by connecting the electrode to a detection circuit that generates an electrical signal that represents the capacitance or a change of the capacitance, such that the detection circuit of the mechanical device may sense the approaching of the external conductor and achieve the non-contact distance sensing.

BRIEF DESCRIPTION OF THE DRAWINGS

For more clearly illustrating technical solutions provided in embodiments of the present disclosure and in the prior arts, accompanying drawings required in the embodiments or the prior arts will be simply introduced hereinafter. Obviously, the accompanying drawings in the following descriptions are only some embodiments of the present disclosure. Other accompanying drawings may also be obtained according to these accompanying drawings by those skilled in the art without paying any creative work.

DETAILED DESCRIPTION

The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work fall within the protection scope of the present disclosure.

The terms "first", "second", and "third" in the embodiments of the present disclosure are only used for the purpose of description, and should not be considered as indicating or implying the relative importance or implicitly indicating the number of technical features indicated. Therefore, a feature defined by the terms "first", "second" and "third" may explicitly or implicitly comprise at least one of such features. In the description of the present disclosure, "a plurality of" means at least two, such as, two, three and more, unless expressly specified otherwise. In addition, the terms "comprising", "including" and "having" and any variations thereof, are intended to cover a non-exclusive inclusion. For example, a process, method, system, article, or device that comprises a series of steps or units does not include only those steps or units that have been listed, but also may optionally comprise other steps or units not expressly listed or optionally comprise other steps or units inherent to such process, method, article, or device.

Reference to "embodiment" herein means that a specific feature, structure, or characteristic described in conjunction with the embodiments may be included in at least one embodiment of the present disclosure. The appearances of the phrase "in one embodiment" in various places in the specification are not necessarily all referring to the same embodiment, nor are separate or alternative embodiments mutually exclusive of other embodiments. Those skilled in the art may clearly and implicitly understand that the embodiments described herein may be combined with other embodiments.

Figure 1:
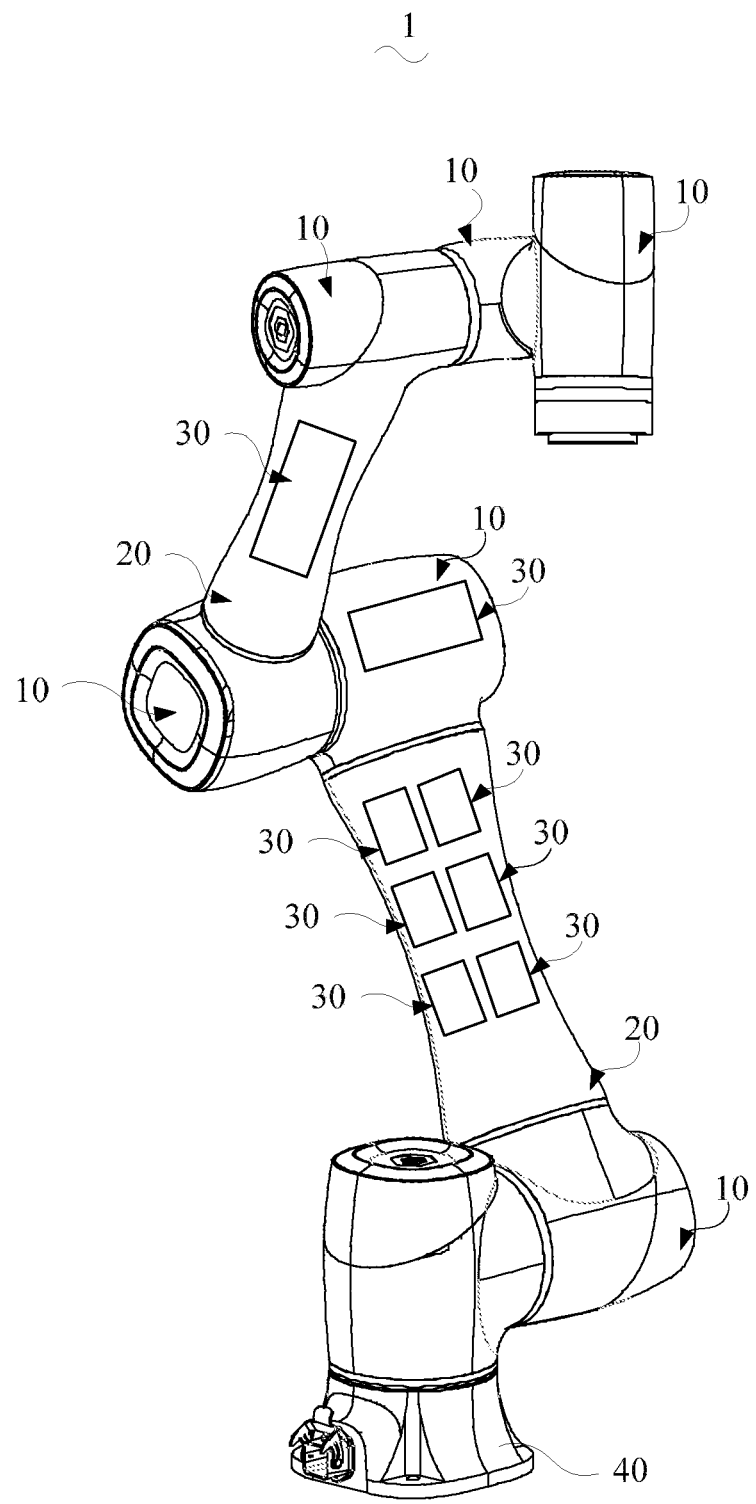
FIG. 1 is a schematic structural view of a device provided by an embodiment of the present disclosure.

Please refer to FIG. 1, which is a schematic structural view of a device provided by an embodiment of the present disclosure. The device of the present disclosure is, for example, a mechanical device or a mechanical device, and specifically may be a robot 1. The robot 1 may comprise at least one joint 10, at least one mechanical arm 20, and at least one electronic skin 30.

It should be noted that FIG. 1 only schematically illustrates that the electronic skin 30 covers part of the surface of the robot 1, and it should be understood that the electronic skin 30 may also cover the entire surface of the robot 1.

The robot 1 may comprises a base 40 and the base 40 is connected to at least one joint 10 or a mechanical arm 20. The base 40 is placed or fixed on the operation platform/operation surface to provide a stable operation environment for the robot 1. Of course, the base 40 may also be movable. For example, a driving wheel is installed at the bottom of the base 40 to drive the robot 1 to move, which facilitates the robot 1 to adapt to mobile operation scenarios and increases the flexibility of the robot 1.

In this embodiment, at least one end of the mechanical arm 20 is connected to a joint 10. The joint 10 comprises, for example, at least one driving component (not shown), which can drive the mechanical arm 20 to swing. The robot 1 may comprise a joint 10 and a mechanical arm 20, or may comprise a plurality of joints 10 and a plurality of mechanical arms 20. The numbers of joints 10 and mechanical arms 20 are based on the actual designs and the use requirements of the robot 1, which will not be limited here. When a plurality of the mechanical arms 20 are provided, two of the mechanical arms 20 are rotatably connected by the joints 10 connected at their respective ends, and the movement of the mechanical arms 20 can be achieved by the relative rotation of at least two joints 10.

In some embodiments, the mechanical arm 20 comprises a metal bracket (not shown) and a robot control system 50. The robot control system 50 is coupled to the electronic skin 30, and the electronic skin 30 can be wrapped on the outer surface of the metal bracket. The metal bracket is, for example, a metal frame or shell of the mechanical arm 20, which can provide a place for the electronic skin 30 to attach. It should be noted that the metal bracket is grounded to ensure the normal operation of the robot. The electronic skin 30 may cooperate with the robot control system 50 to control the mechanical arm 20 to perform operations, such as rotation, swing, obstacle avoidance, and so on.

In other embodiments, the joint 10 comprises a joint bracket (not shown) and a robot control system 50. The robot control system 50 is coupled to the electronic skin 30, and the electronic skin 30 can be wrapped on the outer surface of the joint bracket. Optionally, the material of the joint bracket is, for example, a conductive material such as metal, and the joint bracket can be grounded to ensure the normal operation of the robot 1. Of course, the rotation and driving of the mechanical arm 20 can also be completed by the joint 10, and the electronic skin 30 cooperates with the robot control system 50 to control the joint 10 and the mechanical arm to perform operations, such as rotation, swing, obstacle avoidance, and so on.

It is understandable that both the outer surface of the joint bracket of at least one joint 10 and the outer surface of the metal bracket of at least one mechanical arm 20 can be wrapped with at least one electronic skin 30, and the robot control system 50 may be arranged in the mechanical arm 20 or the joint 10, or arranged in both the joint 10 and the mechanical arm 20. Of course, the mechanical arm 20 and the joint 10 may also share the same robot control system 50, or may be provided with different robot control systems 50.

Figure 2:
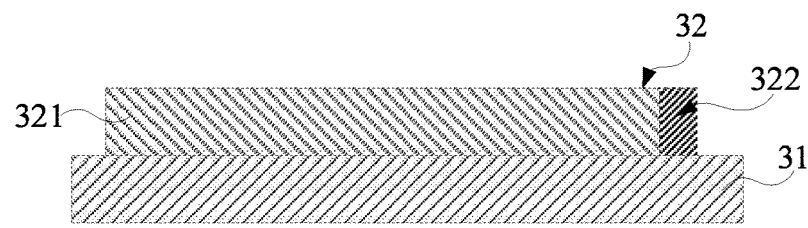
FIG. 2 is a schematic structural view of an electronic skin provided by an embodiment of the present disclosure.

Please refer to FIG. 2, which is a schematic structural view of an electronic skin provided by an embodiment of the present disclosure. The electronic skin 30 may comprises a main body 31 and at least one electrode 32, and the electrode 32 is disposed on the main body 31. The electrode 32 comprises a sensing area 321 and a connection area 322 that are connected to each other. The sensing area 321 of the electrode 32 can constitute a second capacitance C2 with an approaching external conductor (not shown), and the connection area 322 of the electrode 32 is configured to transmit an electrical signal representing the capacitance or a change of the capacitance to the robot control system 50.

An external conductor, such as a human body, when approaching the mechanical arm 20 and/or the joint 10, forms a second capacitance C2 with the electronic skin 30, and the robot control system 50 may generate an electrical signal that represents the capacitance between the external conductor and the electrode 32 or a change of the capacitance between the external conductor and the electrode 32 and determine the distance between the electrode 32 and the external conductor or a change of the distance between the electrode 32 and the external conductor, so as to perceive the distance between the external conductor (such as the human body) and the human body, and may issue instructions to the joint 10 and/or the mechanical arm 20 to control the robot 1 to respond accordingly, avoiding collision with the external conductor or reduce a strength of collision.

The electrode 32 covers an outer side of the mechanical arm 20 or the joint 10, and the shape of the electrode 32 matches with the shape of the outer side of the mechanical arm 20 or the joint 10.

The electrode 32 covering the outer side of the mechanical arm 20 or the joint 10 means that the electrode 32 covers a side of the mechanical arm 20 or the joint 10 away from the robot 1 to facilitate the formation of a capacitance with an approaching conductor.

The shape of the electrode 32 matches with the shape of the outer side of the mechanical arm 20 or the joint 10, that is, the shape of the electrode 32 attached to a side of the mechanical arm 20 or the joint 10 is the same or substantially the same as the shape of the outer surface of the mechanical arm 20 or the joint 10.

Since the shape of the electrode 32 matches with the shape of the outer side of the mechanical arm 20 or the joint 10, the electrode 32 is attached to the outer side of the mechanical arm 20 or the joint 10 to obtain a better fixing effect and enhance the overall structural stability of the robot 1, thus improving the functional performance and making the appearance of the robot 1 more beautiful.

Figure 3:
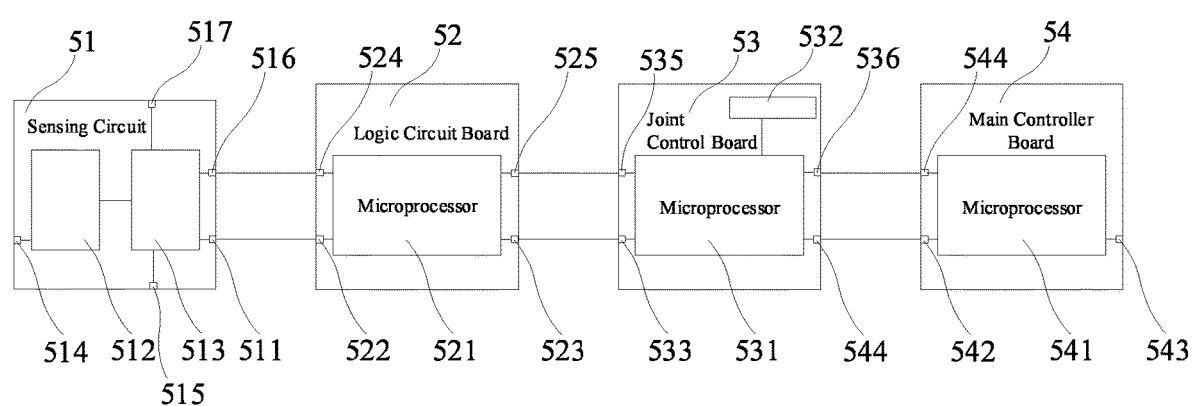
FIG. 3 is a schematic block diagram of a circuit structure of a robot control system provided by an embodiment of the present disclosure.

Please refer to FIG. 3, which is a schematic block diagram of a circuit structure of a robot control system provided by an embodiment of the present disclosure. The robot control system 50 may comprise a sensing circuit 51, a logic circuit board 52, a joint control board 53, and a robot main controller board 54. The sensing circuit 51 is coupled with the logic circuit board 52, the logic circuit board 52 is coupled with the joint control board 53, and the joint control board 53 is coupled with the robot main controller board 54. Of course, the logic circuit board 52 may also be directly coupled with the robot main controller board 54. Alternatively, the sensing circuit 51 may also be directly coupled with the robot control board. It should be noted that the robot control board in the present disclosure may be the joint control board 53, or the robot main controller board 54.

For the mechanical arm 20 comprising the robot control system 50, the sensing circuit 51, the logic circuit board 52, the joint control board 53, and the robot main controller board 54 are not limited to be provided only in the mechanical arm 20, and part of the circuit or circuit board may also be provided in the joint 10, or other parts of the robot. For the joint 10 comprising the robot control system 50, the sensing circuit 51, the logic circuit board 52, the joint control board 53, and the robot main controller board 54 are not limited to be provided only in the joint 10, and part of the circuit or circuit board may also be provided in the mechanical arm 20, or other parts of the robot. For example, the robotic arm 20 and the joint 10 share the same robot control system 50. Both the joint 10 and the robotic arm 20 may be provided with an electronic skin 30. A sensing circuit 51 may be provided in the robotic arm 20, and another sensing circuit 51 may be provided in the joint 10. Alternatively, the mechanical arm 20 and the joint 10 may share a sensing circuit 51. The sensing circuit 51 of the joint 10 and the mechanical arm 20 may be coupled to the same logic circuit board 52, and the logic circuit board 52 may be disposed in the joint 10; the logic circuit board 52 is coupled with the joint 10 control board 53, and the joint control board 53 may be disposed in the joint 10; the joint control board 53 may be coupled with the robot main controller board 54, and the robot main controller board 54 may be disposed in the base 40, joint 10, mechanical arm 20 and other parts of the robot.

Two or more of the sensing circuit 51, the logic circuit board 52, the joint control board 53, and the robot main controller board 54 may be integrated into the same circuit board. The cost and the space occupied by the circuit boards and the cables can be reduced and the loss or interference of electrical signals in the transmission process between different circuit boards can be reduced by reducing the number of circuit boards to be used, such that the value of the final determined distance between the electrode 32 and the external conductor or a change of the distance between the electrode 32 and the external conductor is more accurate.

Figure 4:
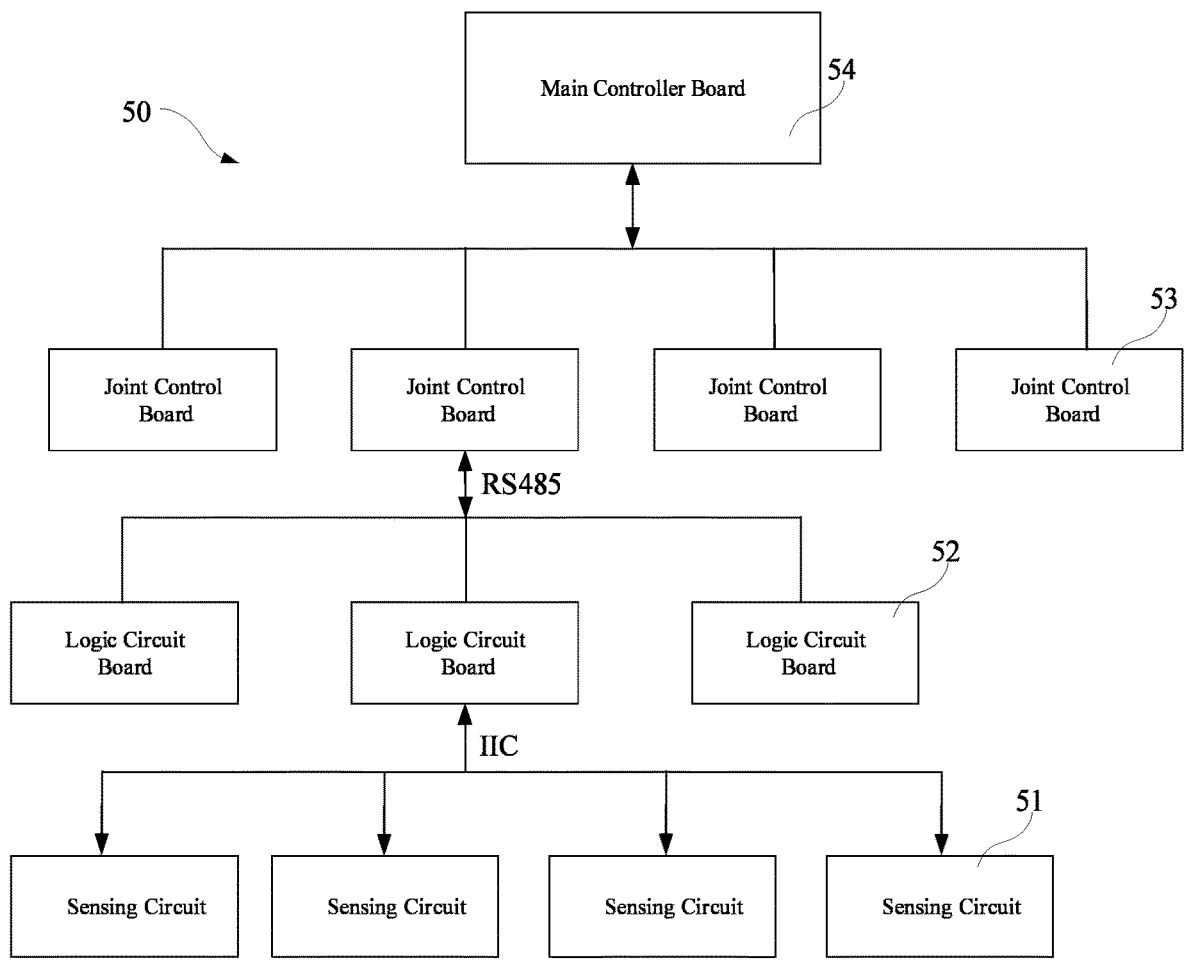
FIG. 4 is a schematic block diagram of a communication architecture of a robot control system provided by an embodiment of the present disclosure.

Please refer to FIG. 4, which is a schematic block diagram of a communication architecture of a robot control system provided by an embodiment of the present disclosure. It should be noted that FIG. 4 only schematically illustrates the communication architecture of the robot control system. It should be understood that the number of the sensing circuit 51, the logic circuit board 52, the joint control board 53, and the robot main controller board 54 may be increased or decreased based on the actual needs. The sensing circuit 51 may comprise a communication terminal 511. The logic circuit board 52 comprises a microprocessor 521, a first communication terminal 522, and a second communication terminal 523. The microprocessor 521 is coupled with the first communication terminal 522 and the second communication terminal 523, respectively, and the first communication terminal 522 is coupled with the communication terminal 511 of the sensing circuit 51. The joint control board 53 comprises a microprocessor 531, a motor drive circuit 532, a first communication terminal 533, and a second communication terminal 534. The microprocessor 534 is coupled with the motor drive circuit 532, the first communication terminal 533, and the second communication terminal 534, respectively. The motor drive circuit 532 is configured to drive the robot 1 to move. The robot main controller board 54 comprises a microprocessor 541, a first communication terminal 542, and a second communication terminal 543. The microprocessor 541 is coupled with the first communication terminal 542 and the second communication terminal 543, respectively. The first communication terminal 542 is configured to couple with the second communication terminal 523 of the logic circuit board 52 or the second communication terminal 533 of the joint control board 53.

The communication terminal 511 of the sensing circuit 51 is coupled with the first communication terminal 522 of the logic control board 52, and the second communication terminal 523 of the logic circuit board 52 is coupled with the first communication terminal 533 of the joint control board 53 or the first communication terminal 542 of the main controller board 54. The first communication terminal 542 of the main controller board 54 is coupled with the second communication terminal 534 of the joint control board 53 or the second communication terminal 533 of the logic circuit board 52. The second communication terminal 543 of the main controller board 54 may be connected to other necessary circuits or components. The transmission of electrical signals among the circuit boards may be achieved through the coupling relationship between the communication terminals among the circuit boards.

Optionally, the second communication terminal 523 of the logic circuit board 52 and the first communication terminal 533 of the joint control board 53 are RS485 communication terminals.

In some other embodiments, the second communication terminal 523 of the logic circuit board 52 may also be directly coupled with the first communication terminal 542 of the main controller board 54, and the logic circuit board 52 directly transmits the electrical signal to the main controller board 54 through the second communication terminal 523. As such, the joint control board 53 is omitted, and thus the loss or interference of the electrical signal transmission between different circuit boards may be reduced.

In this embodiment, the logic circuit board 52 is configured to send a first query information to the sensing circuit 51. The sensing circuit 51 is configured to send a first response information comprising an electrical signal that represents the distance between the electrode 32 and the external conductor or a change of the distance between the electrode 32 and the external conductor to the logic circuit board 52 in order that the logic circuit board 52 processes the electrical signal, in response to reception of the first query information. The joint control board 53 is configured to send a second query information to the logic circuit board 52. The logic circuit board 52 is configured to send a second response information comprising the processed electrical signal to the joint control board 53 in response to reception of the second query information. The joint control board 53 sends the processed electrical signal to the robot main controller board 54. The joint control board 53 is configured to determine the processed electrical signal to obtain an electrical signal representing the distance between the external conductor and the electrode 32 or a change of the distance between the external conductor and the electrode 32.

In this embodiment, the main controller board 54 is connected to the joint control board 53, the joint control board 53 is connected to the logic circuit board 52, the logic circuit board 52 is connected to the sensing circuit 51, the joint control board 53 sends an inquiry information to the logic circuit board 52, the logic circuit board 52 returns the electrical signal sensed by the electronic skin 30 detected by the sensing circuit 51 to the joint control board 53, and the joint control board 53 returns this electrical signal when the main controller board 54 sends an inquiry information to the joint control board 53, which can achieve the unified management for the electronic skin 30 on the whole robot by the main controller board 54 and achieve the application of the electronic skin 30 on the robot 1 more conveniently and reliably.

In this embodiment, the logic circuit board 52 may provide power to the sensing circuit 51. For example, the logic circuit board 52 may comprise a first power terminal 524 and a second power terminal 525. The first power terminal 524 is coupled with the second power terminal 525 and the microprocessor 521 and configured to couple with an external power source. The second power terminal 525 is configured to couple with the sensing circuit 51, and specifically may be coupled to the power terminal 516 of the sensing circuit 51 to supply power to the sensing circuit 51.

The external power source coupled to the first power terminal 524 of the logic circuit board 52 may be from the joint control board 53. In other words, the joint control board 53 may supply power to the logic circuit board 52. For example, the joint control board 53 comprises a first power terminal 535 and a second power terminal 536. The first power terminal 535 is coupled with the second power terminal 536 and the microprocessor 531 and configured to couple with an external power source. The second power terminal 536 is configured to couple with the logic circuit board 52, and specifically may be coupled with the first power terminal 525 of the logic circuit board 52 to supply power to the logic circuit board 52.

The external power source of the joint control board 53 may be directly an external power source, or may be from the main controller board 54.

Figure 5:
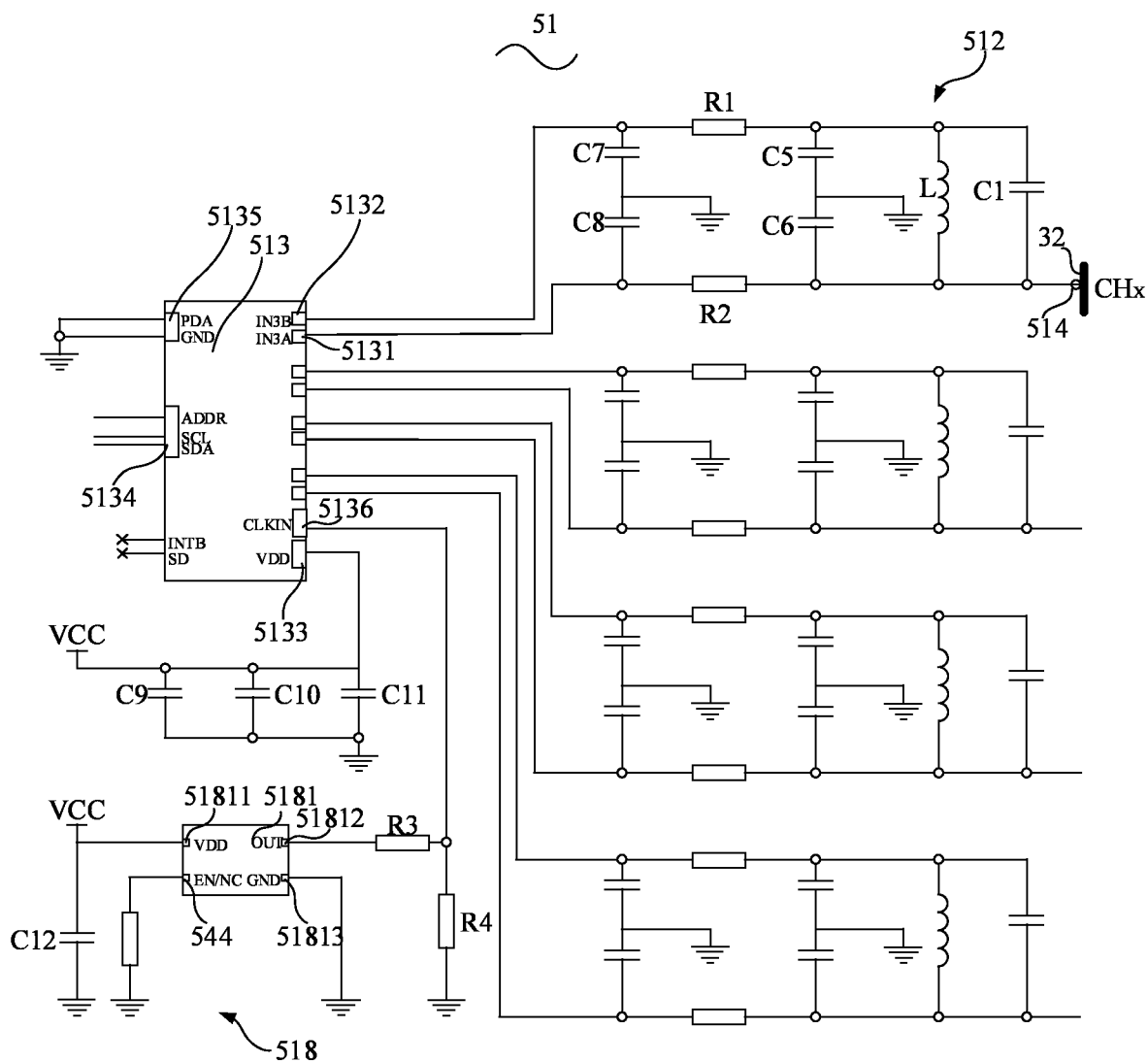
FIG. 5 is a schematic diagram of a circuit structure of a sensing circuit provided by an embodiment of the present disclosure.

Please refer to FIG. 5, which is a schematic diagram of a circuit structure of a sensing circuit provided by an embodiment of the present disclosure. The sensing circuit 51 comprises an oscillatory circuit 512, a detection circuit 513, and a connection terminal 514. The oscillatory circuit 512 and the detection circuit 513 are together coupled with the connection terminal 514, and the connection terminal 514 is coupled with the electrode 32 located on the electronic skin 30. The oscillatory circuit 512 is coupled with the electrode 32 through the connection terminal 514, and to change its oscillation frequency therefore when the external conductor approaches the electrode until a capacitance is generated. The detection circuit 513 is coupled with the oscillatory circuit 512 to detect the oscillation frequency of the oscillatory circuit 512 and output an electrical signal representing the oscillation frequency.

In some embodiments, the oscillatory circuit 512 oscillates in a single oscillation mode, and the detection circuit 513 may measure the oscillation frequency of the oscillatory circuit 512. Please refer to FIG. 5, which is a schematic diagram of an equivalent circuit of an oscillatory circuit in a single oscillation mode provided by the present disclosure.

Specifically, the oscillatory circuit 512 may comprise an inductance L and a first capacitance C1, and the inductance L and the first capacitance C1 constitute an oscillation loop circuit. The oscillatory circuit 512 may be an LC parallel resonance circuit 512 or an LC series resonance circuit 512. The oscillatory circuit 512 is coupled with the detection circuit 513, and the detection circuit 513 is configured to output an excitation signal to the oscillation loop circuit during an oscillation period. Specifically, the excitation signal may be output to the first end of the first capacitance C1 during the oscillation period. The first end of the first capacitance C1 is coupled with the connection terminal 514 and is coupled with the electrode 32 located on the electronic skin 30 through the connection terminal 514. With the above method, the excitation signal output by the detection circuit 513 may be always output to the first end of the first capacitance C1, such that the oscillatory circuit 512 oscillates in a single oscillation mode, and the detection circuit 513 detects the oscillation frequency of the oscillatory circuit 512 or its frequency change. Optionally, the capacitance value of the first capacitance C1 is in the range of 15-40 pF.

When the distance between the electrode 32 and the external conductor is less than a certain range, the electrode 32 and the external conductor constitute a second capacitance C2. The second capacitance C2 is connected in the oscillatory circuit 512, thereby changing the equivalent capacitance value of the oscillatory circuit 512, which in turn changes the oscillation frequency of the oscillatory circuit. Such a change in the oscillation frequency is associated with the second capacitance C2. Since the first capacitance C1 and the inductance L are known, the second capacitance C2 or the data related to the distance between the external conductor and the electrode 32 may be determined.

Figure 6:
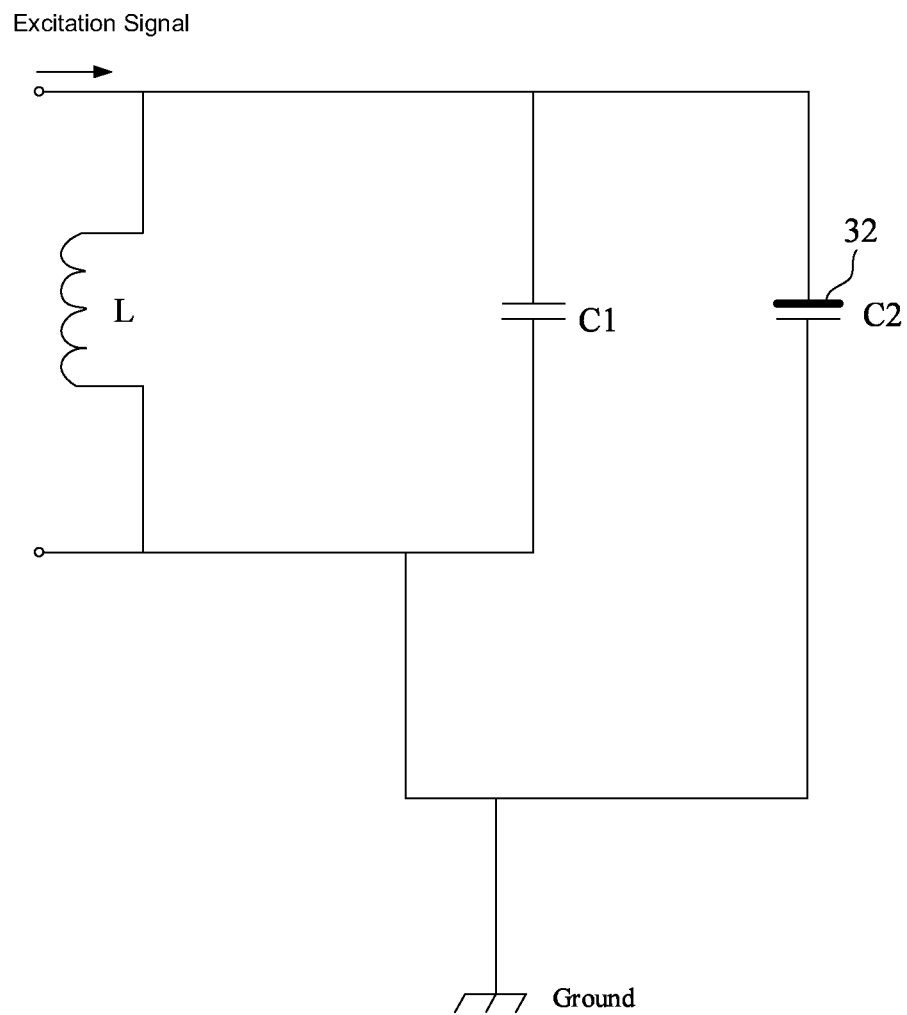
FIG. 6 is a schematic diagram of an equivalent circuit of an oscillatory circuit in a single oscillation mode provided by an embodiment of the present disclosure.

Refer to FIG. 6, which is a schematic diagram of an equivalent circuit of an oscillatory circuit in a single oscillation mode provided by the embodiment of the present disclosure. For a situation of the single oscillation implementation, the second end of the first capacitance C1 is grounded.

$$T = 2\pi\sqrt{L(C_1 + C_2)}.$$

Its entire oscillation period is:
The oscillation frequency detected by the detection circuit 513 is:

$$f_s = \frac{1}{T} = \frac{1}{2\pi\sqrt{L(C_1 + C_2)}}.$$

Figure 7:
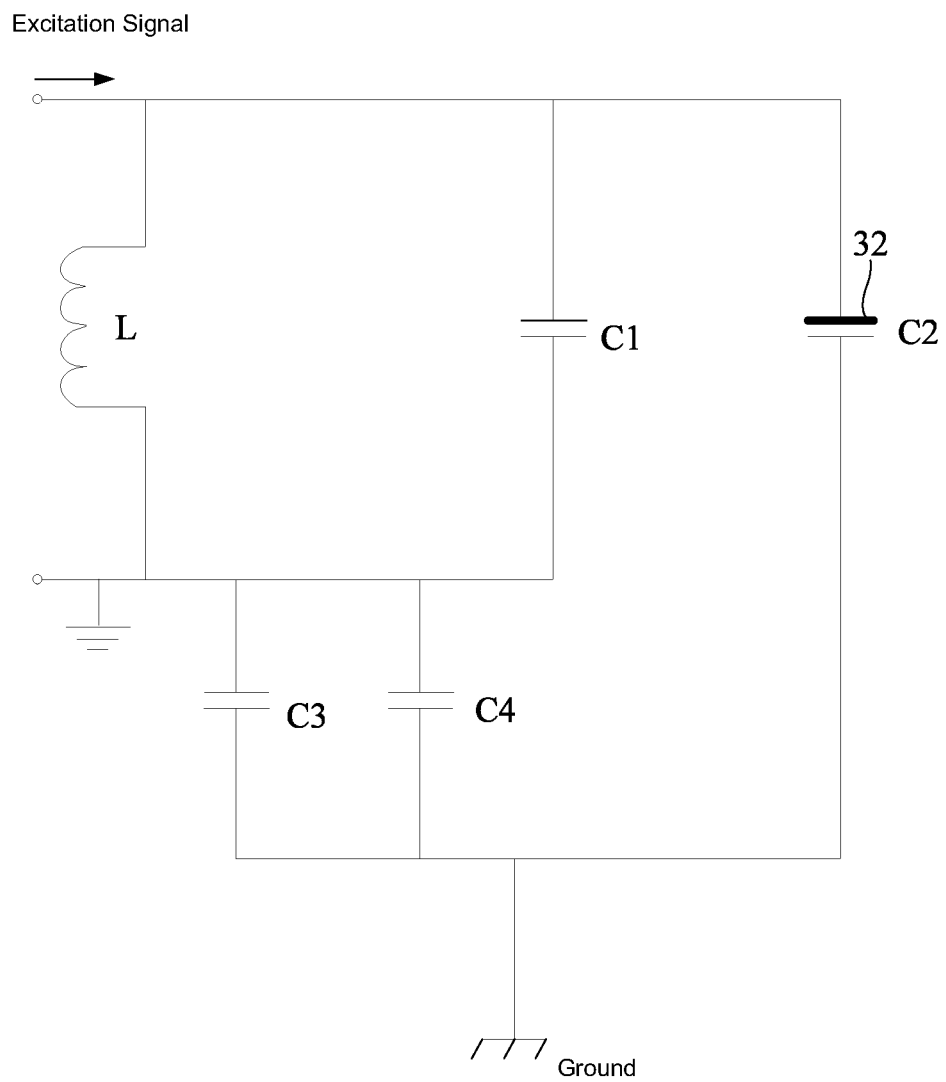
FIG. 7 is a schematic diagram of another equivalent circuit of an oscillatory circuit in a single oscillation mode provided by an embodiment of the present disclosure.

Refer to FIG. 7, which is a schematic diagram of another equivalent circuit of an oscillatory circuit in a single oscillation mode provided by the embodiment of the present disclosure. For another situation of the single oscillation implementation, the oscillatory circuit 512 may comprise a third capacitance C3 and a fourth capacitance C4. A capacitance of the grounding terminal of the sensing circuit 51 to the ground constitutes a third capacitance C3. A capacitance that the grounding terminal is coupled to the mechanical device constitutes a fourth capacitance C4. The fourth capacitance C4 is, for example, a capacitance generated when the grounding terminal is coupled to a main body metal conductor of the mechanical device (such as a metal bracket, a joint bracket, or other additional metal plates). The fourth capacitance C4 is much larger than the third capacitance C3. Because in this manner, the second end of the first capacitance C1 is grounded (signal ground), the grounding terminal of the sensing circuit 51 may be coupled to the second end of the first capacitance C1, or the second end of the second capacitance C2 may be used as the grounding terminal of the sensing circuit 51. In this embodiment, except for the explicit description of being grounded, the rest of the grounds are coupling signal grounds or power grounds.

For example, the determination process of the oscillation frequency of a single oscillation in this situation may be as follows:

$$C_{comb} = \frac{C_2 C_3}{C_2 + C_3} = \beta C_2$$

$$\beta = \frac{1}{1 + \frac{C_2}{C_3}}$$

Since the grounding terminal is connected to the metal frame, which corresponds to connecting a large capacitance in parallel with the third capacitance C3, that is, the third capacitance C3 and the fourth capacitance C4 are connected in parallel, which actually increases the equivalent capacitance of the third capacitance C3. That is, the above formula becomes:

$$C_{comb} = \frac{(C_3 + C_4) \times C_2}{C_3 + C_4 + C_2} = \beta C_2,$$

and $$\beta = \frac{1}{1 + \frac{C_2}{C_3 + C_4}}.$$

Thus, $\beta \approx 1$.

In the first half of the oscillation period:

$$T_1 = \pi\sqrt{L(C_1 + C_{comb})} = \pi\sqrt{LC_1\left(1 + \frac{\beta C_2}{C_1}\right)}.$$

In the second half of the oscillation period: $T_2 = T_1$.
The oscillation frequency detected by the detection circuit 513 is:

$$f_s = \frac{1}{2T_1} = \frac{1}{2\pi\sqrt{LC_1\left(1 + \frac{\beta C_2}{C_1}\right)}}.$$

$T_1$ is the first half of the oscillation period, $T_2$ is the second half of the oscillation period, $C_{comb}$ is the equivalent capacitance, and $\beta$ is the capacitance coefficient.

Since L and C1 are determined, $\beta \approx 1$, and $f_s$ is detected by the detection circuit 513, so $f_s$ is also determined, so that C2 may be determined according to the above formula.

In other embodiments, the oscillatory circuit 512 oscillates in a dual oscillation mode, and the detection circuit 513 may measure the oscillation frequency of the oscillatory circuit 512.

The sensing circuit 51 may comprise a switching circuit, and the switching circuit is coupled with the oscillatory circuit 512. The oscillatory circuit 512 comprises an inductance L and a first capacitance C1 constituting an oscillation loop circuit. The oscillatory circuit 512 may be an LC parallel resonance circuit 512 or an LC series resonance circuit 512.

Figure 8:
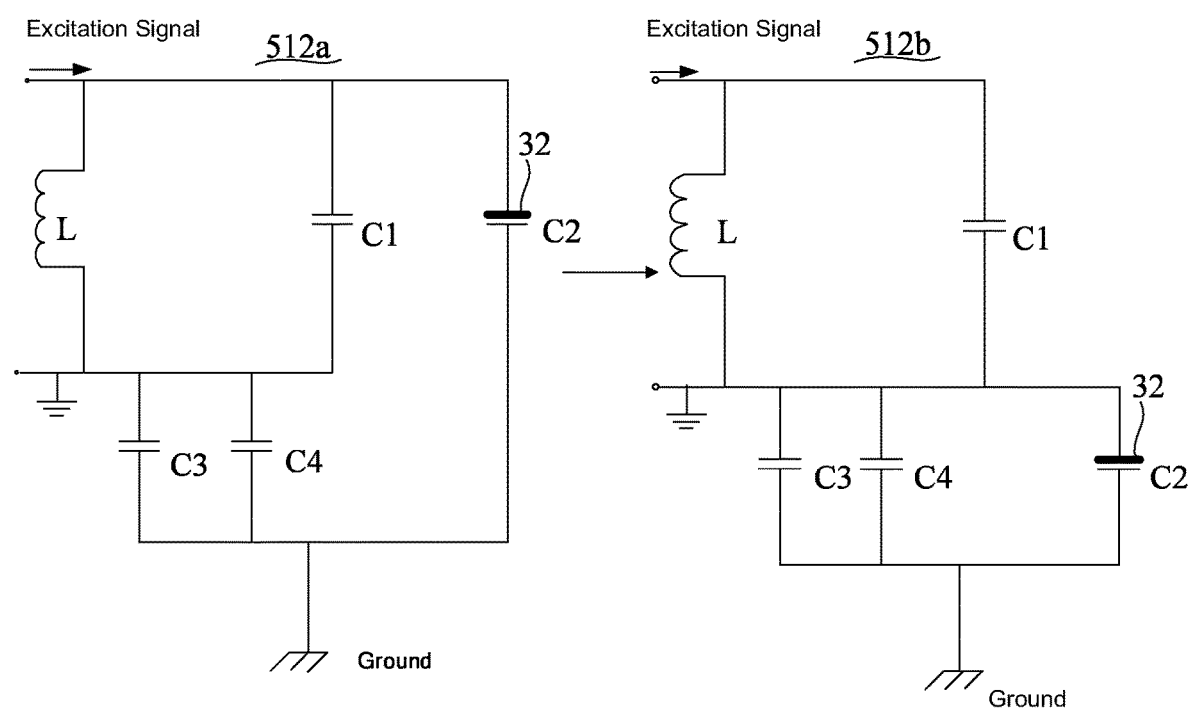
FIG. 8 is a schematic diagram of an equivalent circuit of a first oscillatory circuit and a second oscillatory circuit in a dual oscillation mode provided by an embodiment of the present disclosure.

The oscillatory circuit 512 may comprise a first oscillatory circuit 512a and a second oscillatory circuit 512b. In some situations, the first oscillatory circuit 512a and the second oscillatory circuit 512b may be regarded as the two states of the oscillatory circuit 512. The electrode 32 may belong to one of the first oscillatory circuit 512a or the second oscillatory circuit 512b, and the switching circuit may alternately switch the first oscillatory circuit 512a and the second oscillatory circuit 512b. There are many situations in which the switching circuit switches the first oscillatory circuit 512a and the second oscillatory circuit 512b, which are as follows:

In the first situation, the switching circuit may switch the first oscillatory circuit 512a and the second oscillatory circuit 512b by switching the connection position of the electrode 32 and the oscillatory circuit 512. Please refer to FIG. 8, which is a schematic diagram of an equivalent circuit of the first oscillatory circuit and the second oscillatory circuit in a dual oscillation mode provided by an embodiment of the present disclosure.

The switching circuit couples the electrode 32 to the first end of the first capacitance C1 in the first half of the oscillation period, such that the first capacitance C1 is connected in series with the second capacitance C2 constituted by the electrode 32 and the external conductor. The inductance, the first capacitance C1 and the electrode 32 constitute a first oscillatory circuit 512a. That is, the electrode 32 is coupled with the first end of the first capacitance C1 in the first half of the oscillation period, and specifically, the electrode and the first end of the first capacitance are coupled via the connection terminal 514. The inductance, the first capacitance C1 and the electrode 32 constitute the first oscillatory circuit 512a. For example, the detection circuit 513b may output the excitation signal to the first end of the first capacitance C1, such that the capacitance signal generated by the second capacitance C2 constituted by the electrode 32 and the external conductor can affect the equivalent capacitance value of the oscillatory circuit 512, thereby the inductance L, the first capacitance C1 and the electrode 32 constitute the first oscillatory circuit 512a.

The switching circuit couples the electrode 32 to the second end of the first capacitance C1 in the second half of the oscillation period, such that the electrode 32 is excluded from the oscillatory circuit 512, and the inductance L and the first capacitance C1 constitute the second oscillatory circuit 512b. That is, the electrode 32 is coupled with the second end of the first capacitance in the second half of the oscillation period, and specifically, the electrode and the second end of the first capacitance are coupled via the connection terminal 514. The electrode 32 is excluded from the oscillatory circuit 512. For example, the detection circuit 513 may output the excitation signal to the first end of the first capacitance C1, and the second end of the first capacitance C1 is grounded. Therefore, the electrode 32 is equivalent to being grounded and cannot affect the equivalent capacitance of the oscillatory circuit 512, that is, the electrode 32 is excluded from the oscillatory circuit 512, and the second oscillatory circuit 512 is composed of an inductance and the first capacitance C1.

In this situation, the second end of the first capacitance C1 is grounded and may be coupled to the grounding terminal of the sensing circuit 51, or the second end of the first capacitance C1 may be used as the grounding terminal of the sensing circuit 51.

Figure 9:
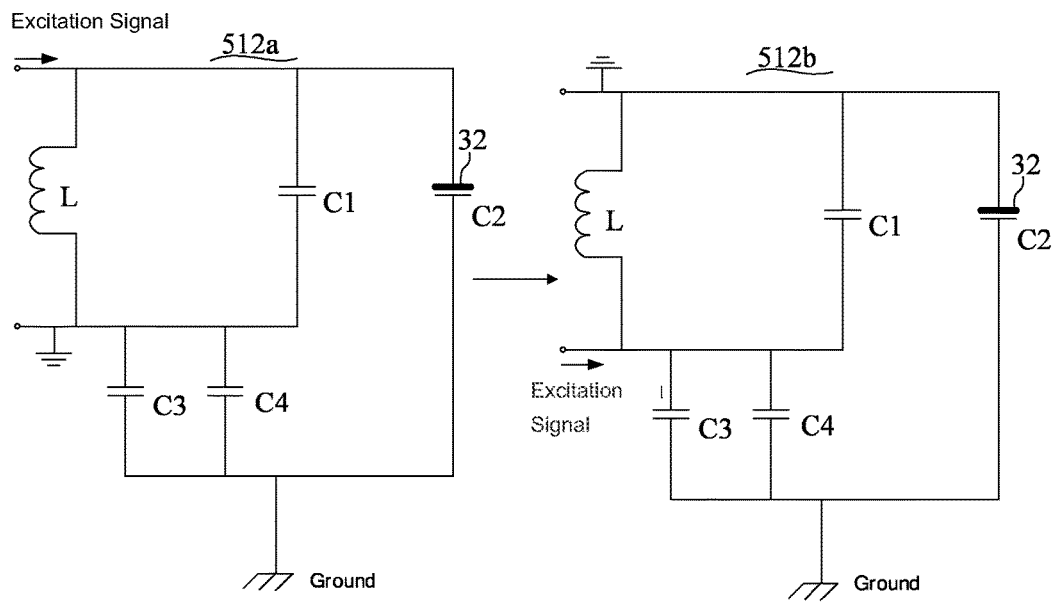
FIG. 9 is a schematic diagram of another equivalent circuit of a first oscillatory circuit and a second oscillatory circuit provided by an embodiment of the present disclosure.

In the second situation, the switching circuit achieves the switching between the first oscillatory circuit 512a and the second oscillatory circuit 512b by switching the excitation signal output by the detection circuit 513 at an output position of the oscillatory circuit 512. Please refer to FIG. 9, which is a schematic diagram of another equivalent circuit of the first oscillatory circuit and the second oscillatory circuit provided by an embodiment of the present disclosure.

The electrode 32 is coupled with the first end of the first capacitance C1 and used to constitute a second capacitance C2 with an external conductor. In this situation, the connection relationship between the electrode 32 and the first end of the first capacitance C1 may be stable and unchanged. The switching circuit outputs the excitation signal output by the detection circuit 513 to the first end of the first capacitance C1 in the first half of the oscillation period, the second end of the first capacitance C1 is grounded, and the inductance L, the first capacitance C1, and the electrode 32 constitute the first oscillatory circuit 512a. As such, the capacitance signal generated by the capacitance constituted by the external conductor and the electrode 32 will affect the equivalent capacitance of the oscillatory circuit 512. The inductance L, the first capacitance C1 and the electrode 32 constitute the first oscillatory circuit 512a.

The switching circuit outputs the excitation signal output by the detection circuit 513 to the second end of the first capacitance C1 in the second half of the oscillation period, and the first end of the first capacitance C1 is grounded, such that the electrode 32 is excluded from the oscillatory circuit 512, and the inductance and the first capacitance C1 constitute the second oscillatory circuit 512. As such, the electrode 32 is grounded through the first end of the first capacitance C1, which cannot affect the equivalent capacitance of the oscillatory circuit 512, such that the electrode 32 is excluded from the oscillatory circuit 512, and the inductance L and the first capacitance C1 constitute the second oscillatory circuit 512b.

In this situation, the first end of the first capacitance C1 is grounded and may be coupled to the grounding terminal of the sensing circuit 51, or the first end of the first capacitance C1 may be used as the grounding terminal of the sensing circuit 51.

For the first and second situations described above, the oscillatory circuit 512 comprises a third capacitance C3 and a fourth capacitance C4. A capacitance of the grounding terminal of the sensing circuit 51 to the ground constitutes a third capacitance C3. A capacitance that the grounding terminal is coupled to the mechanical device constitutes a fourth capacitance C4. The fourth capacitance C4 is, for example, a capacitance generated when the grounding terminal is coupled to a main body metal conductor of the mechanical device (such as a metal bracket, a joint bracket, or other additional metal plates). The fourth capacitance C4 is much larger than the third capacitance C3.

For example, the determination process of the oscillation frequency in the above two situations may be as follows:

$$C_{comb} = \frac{(C_3 + C_4) \times C_2}{C_3 + C_4 + C_2} = \beta C_2, \text{ and}$$

$$\beta = \frac{1}{1 + \frac{C_2}{C_3 + C_4}}.$$

Since the grounding terminal is connected to the metal frame, which is equivalent to connecting a large capacitance in parallel with the third capacitance C3, that is, the third capacitance C3 and the fourth capacitance C4 are connected in parallel, which actually increases the equivalent capacitance of the third capacitance C3. Thus, $\beta \approx 1$.

In the first half of the oscillation period:

$$T_1 = \pi\sqrt{L(C_1 + C_{comb})} = \pi\sqrt{LC_1\left(1 + \frac{\beta C_2}{C_1}\right)}.$$

In the second half of the oscillation period:

$$T_2 = \pi\sqrt{LC_1}.$$

The oscillation frequency $f_s$ detected by the detection circuit 513 is:

$$f_s = \frac{1}{T_1 + T_2} = \frac{1}{\pi\sqrt{LC_1}\left(1 + \sqrt{1 + \frac{\beta C_2}{C_1}}\right)}.$$

Since L and C1 are determined, $\beta \approx 1$, and $f_s$ is detected by the detection circuit 513, so $f_s$ is also determined, so that C2 may be determined according to the above formula.

For C2 determined from the oscillation frequency $f_s$ detected in the single oscillation and dual oscillation modes, for example, the distance between the conductor and the electrode 32 is further determined as follows.

The distance d between the electrode 32 and the external conductor is determined according to C2:

$$C_2 = \frac{\varepsilon S}{4\pi k d}.$$

$T_1$ is the first half of the oscillation period, $T_2$ is the second half of the oscillation period, $C_{comb}$ is the equivalent capacitance, $\beta$ is the capacitance coefficient, $\varepsilon$ is the dielectric constant, S is the facing area between the electrode 32 and the external conductor, and k is the electrostatic force constant.

In this embodiment, an area between one-third and two-thirds of the area of each electrode 32 may be used as the area of the external conductor, and the area of the external conductor may be used as a parameter for detecting the electrical signal. It can be seen from the capacitance determination formula that the value of C2 is proportional to the facing area S between the electrode 32 and the external conductor, and inversely proportional to the distance d between the electrode 32 and the external conductor. In the present disclosure, the area of the electrode 32 that has been installed on the robot is fixed, and an approaching external conductor may be a conductive object, such as human being, animal, or other mechanical device, with different sizes and shapes, and when the same external conductor approaches the electrode 32 at different angles, the areas facing the electrode 32 are also different. Therefore, an area constituting C2 may be equal to an area of each electrode 32, or may be smaller than the area of each electrode 32. After a long-term research and experimentation by the inventors, it is concluded that a value between one-third and two-thirds of the area of the electrode 32 is taken as an area of the external conductor and as an electrical signal parameter. In the case where the facing area S between the external conductor and the electrode 32 is determined, a distance between the external conductor and the electrode 32, that is, a distance between the external conductor and the robot, may be determined more accurately according to the value of C2. Especially, for the case where the external conductor is a human body, the second capacitance obtained by numerical determination is more accurate.

Optionally, the oscillatory circuit 512 may further comprise a fifth capacitance C5 and a sixth capacitance C6. The first end of the fifth capacitance C5 is connected with the first end of the sixth capacitance C6, and the second end of the fifth capacitance C5 is connected with the first end of the capacitance C1. The second end of the sixth capacitance C6 is connected with the second end of the first capacitance C1, and the first end of the fifth capacitance C5 is grounded. Optionally, the capacitance value of the fifth capacitance C5 is in the range of 10-20 pF, and optionally, may be 18 pF. Optionally, the capacitance value of the sixth capacitance C6 is in the range of 10-20 pF, and optionally, may be 18 pF. It is possible, by connecting the fifth capacitance C5 and the sixth capacitance C6 in parallel in the oscillatory circuit 512, to reduce the radiation influence of electromagnetic interference when the signal in the oscillatory circuit 512 is transmitted to the detection circuit 513.

The oscillatory circuit 512 may comprise a seventh capacitance C7 and an eighth capacitance C8. The first end of the seventh capacitance C7 is connected with the first end of the eighth capacitance C8, and the second end of the seventh capacitance C7 is connected with the second end of the fifth capacitance C5. The second end of the eighth capacitance C8 is connected with the second end of the sixth capacitance C6, and the first end of the seventh capacitance C7 is grounded. The capacitance value of the seventh capacitance C7 may be selected to be in the range of 10-20 pF, and optionally, may be 18 pF. The capacitance value of the eighth capacitance C8 may be selected to be in the range of 10-20 pF, and optionally, may be 18 pF. The electromagnetic interference sensitivity in the oscillatory circuit 512 can be reduced by connecting the seventh capacitance C7 and the eighth capacitance C8 in parallel in the oscillatory circuit 512.

The oscillatory circuit 512 may also comprise a first resistor R1 and a second resistor R2. The first resistor R1 is connected between the second end of the seventh capacitance C7 and the second end of the fifth capacitance C5, and the second resistor R2 is connected between the second end of the eighth capacitance C8 and the second end of the sixth capacitance C6. Optionally, the resistance value of the first resistor R1 is in the range of 0-10Ω, and optionally, may be in the range of 1-5Ω. Optionally, the resistance value of the second resistor R2 is in the range of 0-10Ω, and optionally, may be in the range of 1-5Ω. The electromagnetic interference in the oscillatory circuit 512 can be reduced by providing the first resistor R1 and the second resistor R2.

The sensing circuit 51 may comprise a substrate (not shown) and a communication terminal 511, a power terminal 516, and a grounding terminal 517 integrated on the substrate. The detection circuit 513 and the oscillatory circuit 512 are integrated on the substrate. For example, the detection circuit 513 is integrated into a chip, and the oscillatory circuit 512 is integrated on the substrate. The connection terminal 514 may also be integrated on the substrate. The communication terminal 511 is configured to output the electrical signal, the power terminal 516 is configured to couple with an external power source, and the connection terminal 514 is coupled to the first end or the second end of the first capacitance C1.

Optionally, the sensing circuit 51 is a flexible printed circuit. A flexible printed circuit, also known as soft board, flexible board, flexible circuit board, is a highly reliable, flexible printed circuit board made of a flexible insulating substrate (usually polyimide or polyester film). The flexible circuit board has the characteristics, such as a high wiring density, a light weight, a thin thickness, a good flexibility and the like. The flexible circuit board may be bent, wound, and folded freely, may withstand millions of dynamic bending without damaging the wire, may be arranged arbitrarily according to the space layout requirements, and may move and expand arbitrarily in three-dimensional space, so as to achieve the integration of component assembly and wire connection. The cable thickness of the sensing circuit 51 can be reduced and the weight and volume of the robot 1 may be reduced by using the flexible printed circuit.

The detection circuit 513 is coupled with the communication terminal 511, the power terminal 516 and the grounding terminal 517. The detection circuit 513 outputs an electric signal through the communication terminal 511. The power terminal 516 is coupled to the power source and supplies power to the sensing circuit 51. The grounding terminal 517 provides a grounding function.

Further, the detection circuit 513 comprises a first input terminal 5131, a second input terminal 5132, a detection power terminal 5133, a detection communication terminal 5134, and a detection grounding terminal 5135. The first input terminal 5131 is coupled with the first end of the first capacitance C1, and the second input terminal 5132 is coupled with the second end of the first capacitance C1. The detection power terminal 5133 is coupled with the internal power source. The internal power source may be formed by the corresponding adaptation processing to the external power source, which will be described later. The detection communication terminal 5134 is coupled with the communication terminal 511, and the detection grounding terminal 5135 is connected to the grounding terminal 517. The detection communication terminal 5134 is, for example, an IIC communication terminal.

The detection circuit 513 may output an excitation signal to the oscillatory circuit 512 through the first input terminal 5131 or the second input terminal 5132. As such, it may correspond to the input mode of the excitation signal in the above single oscillatory circuit 512, and the detection circuit 513 outputs the excitation signal to the first end of the first capacitance C1 through the first input terminal 5131. It may also correspond to the two situations of switching between the first oscillatory circuit 512a and the second oscillatory circuit 512b. For example, when an excitation signal is output to the oscillatory circuit 512 through the first input terminal 5131, the second input terminal 5132 may be grounded, such that the first end of the first capacitance C1 receives the excitation signal, and the second end of the first capacitance C1 is grounded. For example, when the excitation signal is output to the oscillatory circuit 512 through the second input terminal 5132, the first input terminal 5131 may be grounded, such that the second end of the first capacitance C1 receives the excitation signal, and the first end of the first capacitance C1 is grounded.

The sensing circuit 51 may comprise a ninth capacitance C9, a tenth capacitance C10, and an eleventh capacitance C11. The first end of the ninth capacitance C9, the first end of the tenth capacitance C10, and the first end of the eleventh capacitance C11 are coupled with each other and coupled between the detection power terminal 516 and the internal power source. The second end of the ninth capacitance C9, the second end of the tenth capacitance C10, and the second end of the eleventh capacitance C11 are coupled with each other and grounded. Further, the capacitance values of the ninth capacitance C9, the tenth capacitance C10, and the eleventh capacitance C11 are different. For example, the capacitance value of the ninth capacitance C9 is in the range of 0.5-2 µF, the capacitance value of the tenth capacitance C10 is in the range of 80-150 nF, and the capacitance value of the eleven capacitance C11 is in the range of 8-15 nF. It is possible, by connecting three grounding capacitances with different capacities in parallel at the output end of the internal power source, to filter the ripples and the interference waves in different frequency ranges. Specifically, a capacitance with a larger capacitance may filter the interference with a lower frequency, and a capacitance with a smaller capacitance may filter the interference with a higher frequency, thereby reducing the interference of the power source noise on the electrical signal.

Figure 10:
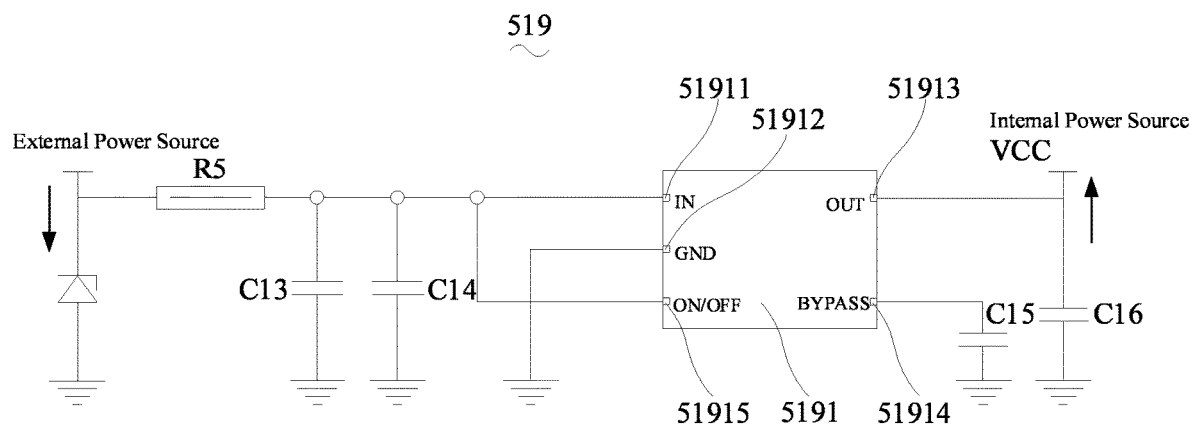
FIG. 10 is a schematic structural view of a step-down circuit provided by an embodiment of the present disclosure.

Please refer to FIG. 10, which is a schematic structural view of a step-down circuit provided by an embodiment of the present disclosure. The sensing circuit 51 may comprise a step-down circuit 519. The step-down circuit 519 is coupled with the power terminal 516, and is configured to step-down the input external power source and output an operation voltage to the detection circuit 513 (or power filter circuit) and the crystal oscillator circuit 518. For example, VCC_5V external power source is input, and VCC_3.3V power source may be output as the internal power source through the step-down circuit 519 for the operation of the sensing circuit 51. The power source output by the step-down circuit 519 has a small ripple and a low noise, such that the interference of the power source noise on the electrical signal can be reduced.

Specifically, the step-down circuit 519 comprises a step-down chip 5191, a fifth resistor R5, a thirteenth capacitance C13, a fourteenth capacitance C14, a fifteenth capacitance C15 and a sixteenth capacitance C16, wherein the step-down chip 5191 comprises an input interface 51911, a GND 51912 was grounded, an output interface 51913, a BYPASS pin 51914 and a switch pin 51915; the input interface 51911 is coupled with the first end of the fifth resistor R5; the second end of the fifth resistor R5 is coupled with the power terminal 511; the first end of the thirteenth capacitance C13 and the first end of the fourteenth capacitance C14 are respectively coupled with the first end of the fifth resistor R5; the second end of the thirteenth capacitance C13 and the second end of the fourteenth capacitance C14 are grounded; the BYPASS pin 51914 is connected to the first end of the fifteenth capacitance C15; the second end of the fifteenth capacitance C15 is grounded; the output interface 51913 is configured to output the internal power; the first end of the sixteenth capacitance C16 is coupled with the output interface 51913; and the second end of the sixteenth capacitance C16 is grounded. The resistance value of the fifth resistor R5 is, for example, in the range of 100-150Ω; the capacitance value of the thirteenth capacitance C13 is, for example, in the range of 8-15 µF; the capacitance value of the fourteenth capacitance is, for example, in the range of 80-150 nF; the capacitance value of the fifteenth capacitance C15 is, for example, in the range of 5-15 nF; and the capacitance value of the sixteenth capacitance C16 is, for example, in the range of 0.8-3 µF.

Referring to FIG. 4, the detection circuit 513 may comprise a crystal oscillator terminal 517, and the sensing circuit 51 comprises a crystal oscillator circuit 518 coupled with the crystal oscillator terminal 517. The crystal oscillator circuit 518 outputs a fixed crystal oscillator frequency to the detection circuit 513 through the crystal oscillator terminal 517, such that the detection circuit 513 can output an excitation signal to the oscillatory circuit 512 during the oscillation period.

The crystal oscillator circuit 518 comprises a crystal oscillator chip 5181, a third resistor R3, a fourth resistor R4, and a twelfth capacitance C12. The crystal oscillator chip 5181 comprises a power pin 51811, an output pin 81822, and a ground pin 51833. The power pin 51811 is coupled with the internal power source and the first end of the twelfth capacitance C12. The second end of the twelfth capacitance C12 is grounded. The output pin 81822 is coupled with the second end of the third resistor R3. The first end of the third resistor R3 is connected to the crystal oscillator terminal 517 and the first end of the fourth resistor R4. The second end of the fourth resistor R4 is grounded. The two ends of the crystal oscillator chip 5181 are externally connected with third resistor R3, the grounded fourth resistor R4 and the twelfth capacitance C12 to enable the crystal oscillator chip 5181 to gain a gain for start-up and ensure that the crystal oscillator circuit 518 continues to oscillate at a fixed frequency.

The capacitance value of the twelfth capacitance C12 is, for example, in the range of 80-150 nF, and optionally, may be 100 nF. The resistance value of the third resistor R3 is, for example, in the range of 0-10Ω, and optionally, may be in the range of 1-5Ω. The resistance value of the fourth resistor R4 is, for example, in the range of 40-60Ω, and optionally 50Ω.

The crystal oscillator circuit 518, after being in operation, can output a corresponding signal to the detection circuit 513, such that the detection circuit 513 is in operation and outputs an excitation signal to the oscillatory circuit 512. When the external conductor approaches the electrode 32, the oscillation frequency of the oscillatory circuit 512 is changed, such that the detection circuit 513 can use the capacitance between the electrode 32 and the external conductor or a change of the capacitance between the electrode 32 and the external conductor to detect the distance between the electrode 32 and the external conductor or a change of the distance between the electrode 32 and the external conductor, thus obtaining an electrical signal representing the distance between the electrode 32 and the external conductor or a change of the distance between the electrode 32 and the external conductor.

The detection circuit 513 detects the electrical signal of the oscillation loop circuit. The electrical signal may comprise measurement data $DATA_X$. The measurement data $DATA_X$ is proportional to a ratio of the measured oscillation frequency $f_s$ and the preset reference frequency $f_r$. The formula is as follows:

$$DATA_X = \frac{f_s \times K}{f_r}$$

wherein K is a preset coefficient related to the properties of the detection circuit 513, and for example, the value range of K is $2^{14} \sim 2^{28}$.

In one manner, the inductance L and the first capacitance C1 constitute an oscillation loop circuit with its fixed oscillation frequency using as a preset reference frequency $f_r$. In another manner, the crystal oscillator frequency of the crystal oscillator chip 5181 is used as the preset reference oscillation frequency $f_r$.

In this embodiment, there are at least two oscillatory circuits 512, which are respectively used for coupling different electrodes 32. The detection circuit 513 is configured to detect the oscillation frequencies of the at least two oscillatory circuits 512 and correspondingly output at least two electrical signals. The different electrodes 32 may be different mechanical arms 20, or different joints, and may also be located at different positions on the same mechanical arm 20 or at different positions on the same joint.

The detection circuit 513 of the present disclosure is coupled with the electrode 32 located on the electronic skin 30 through the connection terminal 514. When an approaching conductor approaches the electrode 32, the electrode 32 and the approaching conductor can constitute a capacitance. When the relative positional relationship between the approaching conductor and the electrode 32 changes, the capacitance value of the capacitance will also change. The distance between the electrode 32 and the conductor or a change of the distance between the electrode 32 and the conductor can be further obtained by connecting the electrode 32 to the detection circuit 513 that generates an electrical signal that represents the capacitance or a change of the capacitance, such that the detection circuit 513 of the mechanical device may sense the approaching of the external conductor, thus achieving the non-contact distance sensing.

The microprocessor of the logic circuit board 52 receives, through the first communication terminal 522, an electrical signal from the sensing circuit 51 that represents the distance between the electrode 32 and the external conductor or a change of the distance between the electrode 32 and the external conductor, and filters the electrical signal to obtain the filtered electrical signal. The noise interference in the circuit may be reduced and improve the accuracy of the electrical signal by filtering the electrical signal.

In one embodiment, the logic circuit board 52 outputs the filtered electrical signal to the joint control board 53 or the main controller board 54 through the second communication terminal 523, and the microprocessor 531 of the joint control board 53 or the microprocessor 541 of the main controller board 54 determines the distance between the electrode 32 and the external conductor or the value of a change in the distance based on the electrical signal.

In another embodiment, the microprocessor 521 of the logic circuit board 52 receives, through the first communication terminal 522, an electrical signal from the sensing circuit 51 that represents the distance between the electrode 32 and the external conductor or a change of the distance between the electrode 32 and the external conductor, and determines the distance between the electrode 32 and the external conductor or the value of a change of the distance according to the electrical signal.

Whether the microprocessors of the logic circuit board 52, the joint control board 53, or the main controller board 54 receives the measurement data $DATA_X$, the distance between the electrode 32 and the external conductor or the value of its change is determined based on the electrical signal, which may be determined in the following way:

According to the relationship between the measured data $DATA_X$ and $f_s$:

$$f_s = \frac{CH_X\_FIN\_SEL \times f_r \times DATA_X}{K}$$

wherein, $CH_{X\_}FIN\_SEL$ is a configuration value of the register in the chip integrated with the detection circuit, and its numerical value is related to the chip used and may be configured. The numerical value of $CH_{X\_}FIN\_SEL$ may be read from the chip.

For the single oscillation mode, $T_1=T_2$, and the second capacitance C2 is determined according to the oscillation frequency $f_s$, and specifically, may be determined by the differential integration method:

$$C_2 = \frac{1}{L \times (2\pi \times f_s)^2 \times \beta} - \frac{C_1}{\beta}.$$

For the dual oscillation mode, the second capacitance C2 is determined according to the oscillation frequency $f_s$, and specifically, may be determined by the differential integration method:

$$2\sqrt{C_1^2 + C_2} + C_2 = \frac{1}{L(f_s\pi)} - 2C_1.$$

Further, the distance d between the electrode 32 and the external conductor is determined based on the capacitance value of the second capacitance C2 and according to the following formula:

$$C_2 = \frac{\varepsilon S}{4\pi k d}$$

wherein, $\varepsilon$ is the dielectric constant, S is the facing area between the electrode 32 and the external conductor, and k is the electrostatic force constant.

Since there are at least two oscillatory circuits 512, the detection circuit 513 is configured to detect the oscillation frequencies of the at least two oscillatory circuits 512 and output at least two electrical signals accordingly. The microprocessor 541 of the main controller board 54 obtains at least two electrical signals from the sensing circuit 51, and determines each electrical signal from the sensing circuit 51 to obtain various electrical signals that represent the distance between the external conductor and the electrode 32 or a change of the distance between the external conductor and the electrode 32.

In some embodiments, the microprocessor 541 of the main controller board 54 obtains various electrical signals that represent the distance between the external conductor and the electrode 32 or a change of the distance between the external conductor and the electrode 32, and then determines the electrical signal representing the smallest distance between the external conductor and the electrode 32 or its largest change of the distance between the external conductor and the electrode 32 as the electrical signal representing the distance between the external conductor and the electrode 32 or a change of the distance between the external conductor and the electrode 32 from the various electrical signals that represent the distance between the external conductor and the electrode 32 or a change of the distance between the external conductor and the electrode 32. For example, when an external conductor approaches the robot 1, the electrodes A and B on the robot 1 sense the approaching of the external conductor and respectively generate electrical signals representing the distance between the external conductor and the electrode 32. The robot 1 may determine the distance between the external conductor and each electrode 32 or a change of the distance between the external conductor and each electrode 32 based on the electrical signal. Then, an electrical signal corresponding to the smallest distance or its largest change of the distance is selected as the electrical signal representing the distance between the external conductor and the robot 1 or a change of the distance between the external conductor and the robot 1. For example, if the distance between the external conductor and the electrode A is determined to be greater than the length between the external conductor and the electrode B, the electrical signal corresponding to the electrode A is selected as the electrical signal representing the distance between the external conductor and the robot 1.

Optionally, the robot 1 may also determine an electrical signal representing the smallest distance between the external conductor and the electrode 32 or its largest change of the distance between the external conductor and the electrode 32 from the generated various electrical signals, as the electrical signal representing the distance between the external conductor and the robot 1 or a change of the distance between the external conductor and the robot 1. For example, when an external conductor approaches the robot 1, the electrodes A and B on the robot 1 sense the approaching of the external conductor and respectively generate electrical signals representing the distance between the external conductor and the electrode 32. The robot 1 may determine the distance between the external conductor and each electrode 32 or a change of the distance between the external conductor and each electrode 32 based on the electrical signal. Then, an electrical signal corresponding to the smallest distance or its largest change of the distance is selected as the electrical signal representing the distance between the external conductor and the metal frame of the robot 1 or a change of the distance between the external conductor and the metal frame of the robot 1. For example, if the distance between the external conductor and the electrode A is determined to be greater than the length between the external conductor and the sensing electrode B, an electrical signal corresponding to the electrode A is selected as the electrical signal representing the distance between the external conductor and the robot 1.

In other embodiments, after the microprocessor 541 of the main controller board 54 obtains various electrical signals that represent the distance between the external conductor and the electrode 32 or a change of the distance between the external conductor and the electrode 32, the coordinates of the external conductor relative to the robot may be determined according to the respective electrical signals representing the distance between the external conductor and the electrode 32 or a change of the distance between the external conductor and the electrode 32 and the coordinates of the corresponding electrode 32.

The coordinates of the electrode 32 are, for example, the coordinates of the electrode 32 relative to the entire robot 1 or some parts thereof in the current movement state of the robot 1, for example, the coordinates relative to the base 40 of the robot 1. Alternatively, the coordinates of the electrodes 32 may also be spatial coordinates relative to the current movement environment of the robot 1. Optionally, the determined coordinates of the external conductor may be the coordinates relative to the entire robot 1 or some parts thereof. In this embodiment, the more electrical signals generated when the robot 1 detects the approaching of the external conductor, the more accurate the coordinates of the external conductor determined based on the electrical signals and the coordinates of the corresponding electrode 32.

For example, the electrodes A and B on the robot 1 sense the approaching of the external conductor and respectively generate electrical signals representing the distance between the external conductor and the electrode 32. A coordinate system is established with the base 40 of the robot 1 as a center. The robot 1 obtains the respective coordinates of the electrode A and the electrode B in the current movement state, and determines the coordinates of the external conductor according to the electrical signal corresponding to each electrode 32 and the coordinates of the corresponding electrode 32.

In some embodiments, it is also possible to determine the coordinates of the external conductor and their changes according to the changes in the electrical signals of various electrode 32, and a running trajectory of the external conductor relative to the robot 1 is predicted based on these coordinates and their changes as well as the movement of the robot 1, such that the robot 1 can avoid obstacles in an appropriate manner according to the running trajectory of the external conductor.

It should be noted that each electrical signal from the sensing circuit 51 corresponds to a different electrode 32. Different electrodes 32 are located at different positions of the same mechanical arm 20, are located at different positions of the same joint 10, or are located on different mechanical arms 20 or joints 10.

In summary, the detection circuit 513 of the present disclosure is coupled with the electrode 32 located on the electronic skin 30 through the connection terminal 514. When an approaching conductor approaches the electrode 32, the electrode 32 and the approaching conductor can constitute a capacitance. When the relative positional relationship between the approaching conductor and the electrode 32 changes, the capacitance value of the capacitance will also change. The distance between the electrode 32 and the conductor or a change of the distance between the electrode 32 and the conductor can be further obtained by connecting the electrode 32 to the detection circuit 513 that generates an electrical signal that represents the capacitance or a change of the capacitance, such that the detection circuit 513 of the mechanical device may sense the approaching of the external conductor, thus achieving the non-contact distance sensing.

What is described above is merely the embodiments of the present disclosure, thus should not be construed to be limiting the patent scope of the present disclosure. Any equivalent structures or equivalent process flow modifications that are made according to the specification and the accompanying drawings of the present disclosure, or any direct or indirect applications of the present disclosure in other related technical fields shall all be covered within the scope of the present disclosure.

The invention claimed is:

1. A sensing circuit for an electronic skin of a device, comprising:
   a connection terminal connected to an electrode located on a housing of a mechanical device; and
   a detection circuit connected to the connection terminal to detect a distance between the electrode and an external conductor or a change of the distance between the electrode and the external conductor by utilizing a capacitance between the electrode and the external conductor or a change of the capacitance between the electrode and the external conductor, thus obtaining a first electrical signal representing the distance between the electrode and the external conductor or a change of the distance between the electrode and the external conductor.

2. The sensing circuit according to claim 1, comprising:
   an oscillatory circuit configured to couple with the connection terminal, to couple with the electrode through the connection terminal, and to change an oscillation frequency therefore when the external conductor approaches the electrode until a capacitance is generated,
   wherein the detection circuit is specifically configured to couple with the oscillatory circuit, to detect the oscillation frequency, and to output a second electrical signal representing the oscillation frequency.

3. The sensing circuit according to claim 2, wherein:
   the oscillatory circuit comprises an inductance and a first capacitance constituting an oscillation loop circuit, and the electrode is connected to a first end of the first capacitance and configured to constitute a second capacitance with the external conductor; and
   the detection circuit is configured to output an excitation signal to the first end of the first capacitance in an oscillation period, and a second end of the first capacitance is grounded.

4. The sensing circuit according to claim 2, comprising:
   a switching circuit configured to couple with the oscillatory circuit,
   wherein the oscillatory circuit comprises a first oscillatory circuit and a second oscillatory circuit, the electrode belongs to one of the first oscillatory circuit and the second oscillatory circuit, and the switching circuit alternately switches the first oscillatory circuit and the second oscillatory circuit.

5. The sensing circuit according to claim 4, wherein:
   the oscillatory circuit comprises an inductance and a first capacitance constituting an oscillation loop circuit;
   the switching circuit is configured to couple the electrode to the first end of the first capacitance in a first half of an oscillation period, such that the first capacitance and a second capacitance constituted by the electrode and the external conductor are connected in series, and the inductance, the first capacitance, and the electrode constitute the first oscillatory circuit; and
   the switching circuit is configured to couple the electrode to a second end of the first capacitance in a second half of the oscillation period, such that the electrode is excluded from the oscillatory circuit, and the inductance and the first capacitance constitute the second oscillatory circuit.

6. The sensing circuit according to claim 4, wherein:
   the oscillatory circuit comprises an inductance and a first capacitance constituting an oscillation loop circuit, and the electrode is connected to a first end of the first capacitance and is configured to constitute a second capacitance with the external conductor;
   the switching circuit is configured to output an excitation signal output by the detection circuit to the first end of the first capacitance in a first half of an oscillation period, a second end of the first capacitance is grounded, and the inductance, the first capacitance and the electrode constitute the first oscillatory circuit; and
   the switching circuit is configured to output the excitation signal output by the detection circuit to the second end of the first capacitance in a second half of the oscillation period, the first end of the first capacitance is grounded such that the electrode is excluded from the oscillatory circuit, and the inductance and the first capacitance constitute the second oscillatory circuit.

7. The sensing circuit according to claim 3, wherein:
the oscillatory circuit comprises a third capacitance and a fourth capacitance, the third capacitance is a capacitance of a grounding terminal of the sensing circuit to ground, the fourth capacitance is a capacitance that the grounding terminal is coupled to the mechanical device, and the fourth capacitance is much larger than the third capacitance; and wherein a second end of the first capacitance is grounded and the grounding terminal is coupled with the second end of the first capacitance, or a first end of the first capacitance is grounded and the grounding terminal is coupled with the first end of the first capacitance.

8. The sensing circuit according to claim 3, wherein:
the sensing circuit comprises a substrate, a communication terminal, a power terminal and a grounding terminal are integrated on the substrate, the detection circuit and the oscillatory circuit are integrated on the substrate, the detection circuit is coupled with the communication terminal, the power terminal and the grounding terminal, the connection terminal is integrated on the substrate, and the oscillatory circuit and the detection circuit are together coupled with the connection terminal.

9. The sensing circuit according to claim 8, wherein:
the communication terminal is configured to output the first electrical signal, the power terminal is configured to couple with an external power source, and the connection terminal is coupled with the first end or the second end of the first capacitance.

10. The sensing circuit according to claim 8, wherein:
the detection circuit comprises a first input terminal, a second input terminal, a detection power terminal, a detection communication terminal and a detection grounding terminal, the first input terminal is coupled with the first end of the first capacitance, and the second input terminal is coupled with the second end of the first capacitance; and
the detection power terminal is coupled with an internal power source, the detection communication terminal is coupled with the communication terminal, the detection grounding terminal is connected to the grounding terminal, and the detection communication terminal is a IIC communication terminal.

11. The sensing circuit according to claim 10, wherein:
the detection circuit comprises a crystal oscillator terminal, and the sensing circuit comprises a crystal oscillator circuit configured to output a fixed crystal oscillator frequency to the detection circuit by the crystal oscillator terminal, so that the detection circuit outputs an excitation signal to the oscillatory circuit during an oscillation period.

12. The sensing circuit according to claim 10, wherein:
the sensing circuit comprises a step-down circuit coupled with the power terminal and is configured to receive an external power source, perform step-down processing and output an operation voltage to the detection circuit and the oscillatory circuit.

13. The sensing circuit according to claim 3, wherein:
an area between one-third and two-thirds of the electrode area is taken as an area of the external conductor, and the area of the external conductor is taken as a parameter for detecting the first electrical signal.

14. The sensing circuit according to claim 2, wherein:
the second electrical signal comprises measurement data, and the measurement data is proportional to a ratio of the oscillation frequency to a preset reference frequency.

15. The sensing circuit according to claim 1, wherein:
at least two oscillatory circuits are provided, and the at least two oscillatory circuits are respectively configured to couple with different electrodes; and
the detection circuit is configured to detect the oscillation frequencies of the at least two oscillatory circuits and correspondingly output at least two electrical signals.

16. A robot control system comprising a sensing circuit, a logic circuit board, a joint control board, and a robot main controller board, wherein:
the sensing circuit is configured for an electronic skin of a device, comprising a connection terminal connected to an electrode located on a housing of a mechanical device;
a detection circuit is connected to the connection terminal to detect a distance between the electrode and an external conductor by utilizing a capacitance between the electrode and the external conductor or a change of the capacitance between the electrode and the external conductor, thus obtaining an electrical signal representing the distance between the electrode and the external conductor or a change of the distance between the electrode and the external conductor;
the logic circuit board is configured to couple with the sensing circuit; and
the joint control board is configured to couple with the logic circuit board, and comprises a motor drive circuit configured to drive a robot to move.

17. The robot control system according to claim 16, wherein the robot main controller board is configured to couple with the logic circuit board or the joint control board, and to process a signal from the sensing circuit to obtain the electrical signal representing the distance between the external conductor and the electrode or the change of the distance between the external conductor and the electrode.

18. The robot control system according to claim 16, wherein two or more of the sensing circuits, the logic circuit board, the joint control board and the robot main controller board are integrated on the same circuit board.

19. The robot control system according to claim 16, wherein:
the logic circuit board is configured to send a first query information to the sensing circuit;
the sensing circuit is configured to send a first response information comprising the electrical signal that represents the distance between the electrode and the external conductor or a change of the distance between the electrode and the external conductor to the logic control board in order that the logic control board processes the electrical signal, in response to reception of the first query information;
the joint control board is configured to send a second query information to the logic circuit board;
the logic circuit board is configured to send a second response information comprising the processed electrical signal to the joint control board in response to reception of the second query information; and
the joint control board is configured to send the processed electrical signal to the robot main controller board.

20. A robot comprising the robot control system according to claim 16.

21. The robot according to claim 20, wherein:
the robot comprises at least one joint, at least one mechanical arm, and at least one electronic skin, the mechanical arm is connected with the joint, the mechanical arm comprises a metal bracket, and the electronic skin is wrapped on the metal bracket; and/or
the joint comprises a joint bracket, and the electronic skin is wrapped on the joint bracket.

\* \* \* \* \*